United States Patent
Lee

(10) Patent No.: US 7,995,693 B2
(45) Date of Patent: Aug. 9, 2011

(54) METHOD AND APPARATUS FOR SERIAL COMMUNICATION USING CLOCK-EMBEDDED SIGNALS

(75) Inventor: Sang-Keun Lee, Asan-si (KR)

(73) Assignee: Samsung Electronics Co., Ltd. (KR)

( * ) Notice: Subject to any disclaimer, the term of this patent is extended or adjusted under 35 U.S.C. 154(b) by 890 days.

(21) Appl. No.: 11/968,548

(22) Filed: Jan. 2, 2008

(65) Prior Publication Data

US 2008/0170643 A1 Jul. 17, 2008

(30) Foreign Application Priority Data

Jan. 12, 2007 (KR) .................. 10-2007-0003602

(51) Int. Cl.
*H04L 7/02* (2006.01)
*H04L 7/00* (2006.01)
*H04L 27/02* (2006.01)
(52) U.S. Cl. .................. 375/359; 375/355; 375/259
(58) Field of Classification Search .................. 375/259, 375/219, 354, 355, 257, 353, 359, 361; 370/503
See application file for complete search history.

(56) References Cited

U.S. PATENT DOCUMENTS

| | | | | |
|---|---|---|---|---|
| 2002/0153936 A1* | 10/2002 | Zerbe | ............................ | 327/336 |
| 2005/0135413 A1* | 6/2005 | Yang et al. | .................... | 370/463 |
| 2005/0259772 A1* | 11/2005 | Voutilainen | .................... | 375/353 |
| 2006/0186915 A1* | 8/2006 | Werner et al. | .................. | 326/21 |
| 2006/0268699 A1* | 11/2006 | Balandin et al. | ............. | 370/230 |

* cited by examiner

*Primary Examiner* — Tesfaldet Bocure
(74) *Attorney, Agent, or Firm* — Innovation Counsel LLP

(57) ABSTRACT

Apparatus for serial communication using embedded clock signals includes a data divider for dividing a data stream into odd-numbered and even-numbered data streams; a clock-embedded signal generator for generating odd-numbered and even-numbered embedded clock signals by pulse amplitude modulating the odd-numbered and even-numbered data streams and, when an external clock is input, inverting polarities of the pulse amplitude modulated odd-numbered and even-numbered data streams; a clock-embedded signal recovery unit for recovering the odd-numbered and even-numbered data streams by comparing amplitudes of the odd-numbered and even-numbered embedded clock signals with reference voltages, respectively, and recovering synchronization information of the clock by detecting when amplitude polarities of the odd-numbered and even-numbered embedded clock signals are inverted; and a data integrator for integrating the odd-numbered and even-numbered data streams and supplying the result as the data stream.

10 Claims, 10 Drawing Sheets

METHOD AND APPARATUS FOR SERIAL COMMUNICATION USING CLOCK-EMBEDDED SIGNALS

CROSS-REFERENCE TO RELATED APPLICATION

This application claims priority under 35 U.S.C. §119 to Korean Patent Application No. 10-2007-0003602, filed on Jan. 12, 2007, the disclosure of which is incorporated herein by reference in its entirety.

BACKGROUND OF THE INVENTION

1. Field of the Invention

The present invention relates to serial communications, and more particularly, to a method and apparatus for serial communication using clock-embedded signals.

2. Description of the Related Art

High-definition video may be transmitted between electronic devices such as a digital television, personal computers, monitors, etc. through international interface standards such as the Unified Display Interface ("UDI") led by the European CE (Conformite Europeenne) companies and the Display Port led by leading PC and consumer electronics companies.

The UDI is an expansion of the High-Definition Multimedia Interface ("HDMI") accepted as an industrial standard in the field of large screen digital televisions above 30 inches. The Display Port is a new interface standard having a maximum bandwidth of 10.8 Gbps, which is more than twice the existing Digital Visual Interface ("DVI") having a bandwidth of 4.95 Gbps.

Other signaling protocols, such as low-voltage differential signaling ("LVDS"), DVI, HDMI, reduced swing differential signaling ("RSDS"), mini-LVDS, point-to-point differential signaling ("PPDS"), and external protocol employ a dedicated channel for clock transmission. The embedded protocol of the UDI and the Display Port use a signaling scheme in which clock information is embedded in the data stream using 8B/10B coding of the American National Standards Institute ("ANSI").

Conventional techniques using separate wiring for the clock channel may increase electromagnetic interference. On the other hand, embedding clock information in the data stream requires that 8-bit data be converted into 10-bit data, thereby incurring a 2-bit overhead during 8-bit data transmission.

SUMMARY OF THE INVENTION

According to one aspect of the present invention, clock information is embedded in a data stream without increasing bit overhead by inverting the polarities of odd-numbered and even-numbered data signals and transmitting the data and embedded clock information as 4-level pulse amplitude modulated signals.

In accordance with an aspect of the present invention, apparatus for serial communication using embedded clock signals, comprises a data divider for dividing a data stream into odd-numbered and even-numbered data streams; a clock-embedded signal generator for generating odd-numbered and even-numbered embedded clock signals by pulse amplitude modulating the odd-numbered and even-numbered data streams and, when an external clock is input, inverting the polarities of the pulse amplitude modulated odd-numbered and even-numbered data streams; a clock-embedded signal recovery unit for recovering the odd-numbered and even-numbered data streams by comparing amplitudes of the odd-numbered and even-numbered embedded clock signals with reference voltages, respectively, and recovering synchronization information of the clock by detecting when amplitude polarities of the odd-numbered and even-numbered embedded clock signals are inverted; and a data integrator for integrating the odd-numbered and even-numbered data streams and supplying the result as the data stream.

The embedded clock signal generator may include: a first signal generator for generating the odd-numbered embedded clock signal; and a second signal generator for generating the even-numbered embedded clock signal, wherein the first and second signal generators pulse amplitude modulate the odd-numbered and even-numbered data streams to have amplitudes having different polarities, respectively.

The first signal generator may include: a first positive polarity signal generator for pulse amplitude modulating the odd-numbered data stream into a signal having two positive polarity amplitudes; a first negative polarity signal generator for pulse amplitude modulating the odd-numbered data stream into a signal having two negative polarity amplitudes; and a first clock information inserter for alternately switching the odd-numbered data stream to the positive polarity signal generator and the negative polarity signal generator in response to the clock.

The second signal generator may include: a second positive polarity signal generator for pulse amplitude modulating the even-numbered data stream into a signal having two positive polarity amplitudes; a second negative polarity signal generator for pulse amplitude modulating the even-numbered data stream into a signal having two negative polarity amplitudes; and a second clock information inserter for alternately switching the even-numbered data stream to the negative polarity signal generator and the positive polarity signal generator in response to the clock.

In accordance with an exemplary embodiment of the present invention, there is provided a method for serial communication using embedded clock signals, the method including: dividing a data stream into odd-numbered and even-numbered data streams; pulse amplitude modulating the odd-numbered and even-numbered data streams into reference level voltages, respectively; generating odd-numbered and even-numbered embedded clock signals by inverting polarities of amplitudes corresponding to the odd-numbered and even-numbered data streams in response to a clock; recovering the odd-numbered and even-numbered data streams by comparing amplitudes of the odd-numbered and even-numbered embedded clock signals with reference voltages, respectively; and recovering synchronization information of the clock by detecting when polarities of amplitudes of the odd-numbered and even-numbered embedded clock signals are inverted.

The reference level voltages may include a first level voltage of positive polarity, a second level voltage of positive polarity, a first level voltage of negative polarity, and a second level voltage of negative polarity.

The odd-numbered and even-numbered data streams may be modulated by varying polarities.

The odd-numbered and even-numbered data streams may be converted into a first level voltage of positive polarity or a first level voltage of negative polarity when a data value of the odd-numbered and even-numbered data streams is "1", and converted into a second level voltage of positive polarity or a second level voltage of negative polarity when the data value of the odd-numbered and even-numbered data streams is "0".

The reference voltages may include a first reference voltage having an intermediate value between the first level voltage of positive polarity and the second level voltage of positive polarity, and a second reference voltage having an intermediate value between the first level voltage of negative polarity and the second level voltage of negative polarity.

The odd-numbered and even-numbered data streams may be recovered by comparing amplitude voltages of the odd-numbered and even-numbered embedded clock signals with the reference voltages.

In accordance with a further aspect of the present invention, there is provided an apparatus for serial communication using embedded clock signals, the apparatus including: a clock-embedded signal generator for generating a data signal and a data-bar signal displaying a data stream according to relative positions and, when an external clock is input, generating a clock-embedded data signal and a clock-embedded data-bar signal by equalizing the data signal and the data-bar signal; and a clock-embedded signal recovery unit for recovering the data signal and the data-bar signal according to relative positions of the clock-embedded data signal and the clock-embedded data-bar signal, and recovering synchronization information of the clock by detecting when the clock-embedded data signal and the clock-embedded data-bar signal are equalized.

The data signal and the data-bar signal may have an inverted phase with respect to each other.

The embedded clock signal generator may include: a data signal generator for generating the data signal; a data-bar signal generator for generating the data-bar signal; a clock-embedded control unit for generating a control signal equalizing the data signal and the data-bar signal in response to the clock; and a clock embedding unit for equalizing the data signal and the data-bar signal in response to the control signal.

The embedded clock signal recovery unit may include: a data stream recovery unit for recovering the data stream by receiving and comparing the clock-embedded data signal and the clock-embedded data-bar signal; and a clock synchronization recovery unit for recovering the synchronization information of the clock by detecting when the clock-embedded data signal and the clock-embedded data-bar signal are equalized.

In accordance with a still further aspect of the present invention, there is provided a method for serial communication using embedded clock signals, the method including: generating a data signal and a data-bar signal displaying a data stream according to relative positions; generating a clock-embedded data signal and a clock-embedded data-bar signal by equalizing the data signal and the data-bar signal in response to a clock; recovering the data signal and the data-bar signal according to relative positions of the clock-embedded data signal and the clock-embedded data-bar signal; and recovering synchronization information of the clock by detecting when the clock-embedded data signal and the clock-embedded data-bar signal are equalized.

The data signal having a first level voltage and the data-bar signal having a second level voltage may be generated when the data stream is "1", and the data signal having the second level voltage and the data-bar signal having the first level voltage may be generated when the data stream is "0".

The first level voltage and the second level voltage may have an inverted polarity with respect to each other.

The first level voltage may be greater than the second level voltage when the data stream is "1", and the first level voltage may be smaller than the second level voltage when the data stream is "0".

The data value "1" may be recovered when the data signal is greater than the data-bar signal, and the data value "0" may be recovered when the data signal is smaller than the data-bar signal.

The time point at which the data signal is the same as the data-bar signal may be detected to supply the clock synchronization.

BRIEF DESCRIPTION OF THE DRAWINGS

Exemplary embodiments of the present invention can be understood in more detail from the following descriptions taken in conjunction with the accompanying drawings in which.

DETAILED DESCRIPTION OF THE INVENTION

Figure 1:
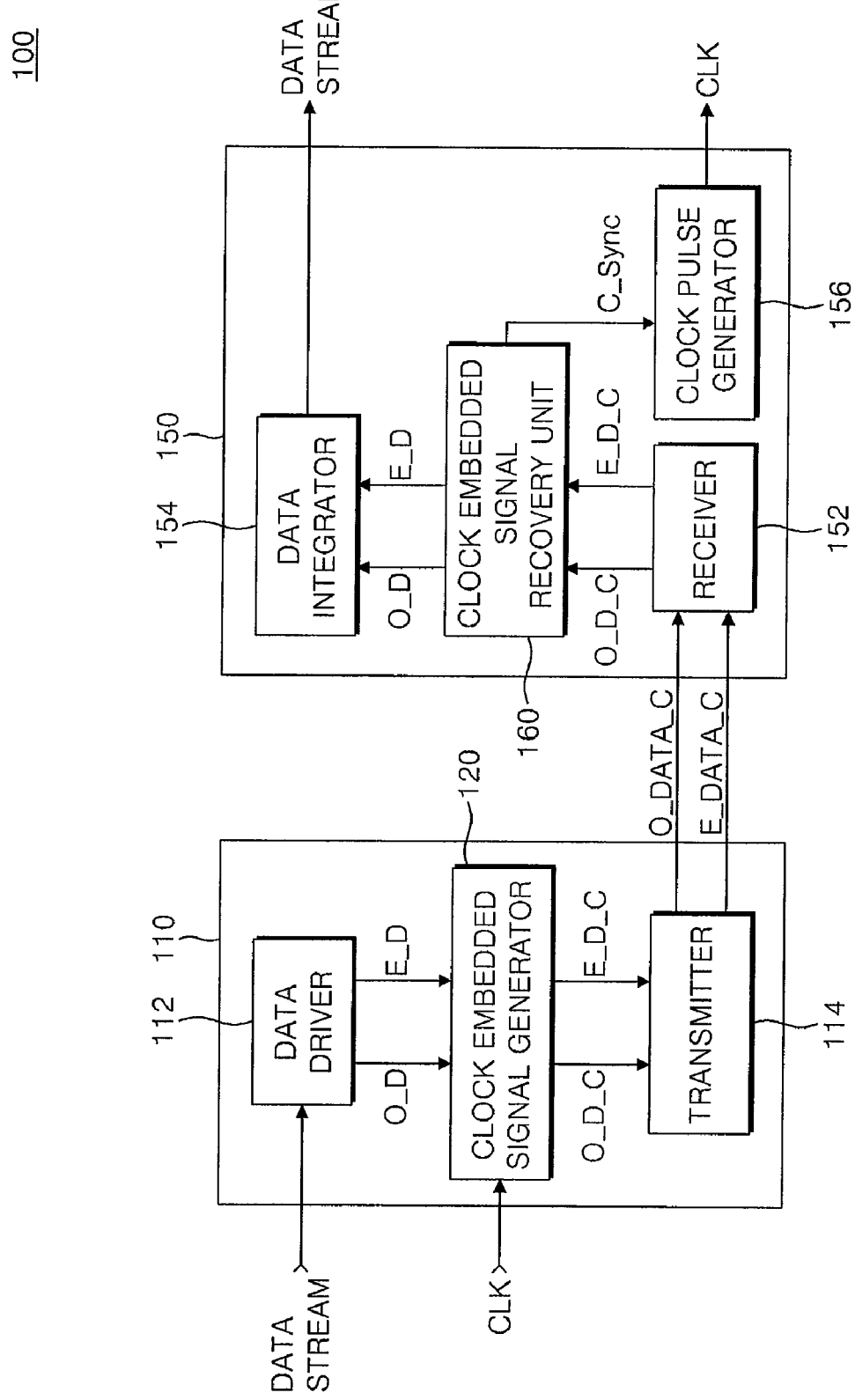
FIG. 1 is a block diagram of an apparatus for serial communication using embedded clock signals in accordance with an exemplary embodiment of the present invention.

FIG. 1 is a block diagram of an apparatus for serial communication using embedded clock signals in accordance with an exemplary embodiment of the present invention. As shown in FIG. 1, the apparatus 100 for serial communication using embedded clock signals includes a transmitting device 110 and a receiving device 150.

The transmitting device 110 transmits embedded clock data signals E_DATA_C and O_DATA_C, generated by embedding clock CLK information in a data stream DATA STREAM, to the receiving device 150. The transmitting device 110 includes a data divider 112, a clock-embedded signal generator 120, and a transmitter 114. The data divider 112 divides the data stream DATA STREAM supplied from the outside into an odd-numbered data O_D stream and an even-numbered data E_D stream and provides them to the clock-embedded signal generator 120.

The embedded clock signal generator 120 pulse amplitude modulates (PAM) the odd-numbered data O_D stream and the even-numbered data E_D stream supplied from the data divider 112 and, at the same time, generates embedded clock signals O_D_C and E_D_C by embedding the clock CLK information received from the outside in the odd-numbered data O_D stream and the even-numbered data E_D stream, and provides them to the transmitter 114.

The pulse amplitude modulation (PAM) performs to convert the odd-numbered data O_D and the even-numbered data E_D into a signal having two positive polarity amplitudes displaying 0 and 1 and a signal having two negative polarity amplitudes displaying 0 and 1, respectively. The clock CLK information is embedded at the point when the polarities of the pulse amplitude modulated odd-numbered data O_D stream and even-numbered data E_D stream are inverted from positive to negative or vice versa.

The transmitter 114 converts the clock-embedded signals O_D_C and E_D_C applied from the clock-embedded signal generator 120 into the clock-embedded data signals E_DATA_C and O_DATA_C and transmits them to the receiving device 150 through two transmission lines. The transmitter 114 performs a buffering function to simultaneously transmit the clock-embedded signals O_D_C and E_D_C through the two transmission lines in the form of a differential signal. The transmitter 114 amplifies the clock-embedded signals O_D_C and E_D_C to be converted into the clock-embedded data signals E_DATA_C and O_DATA_C suitable for the transmission.

The receiving device 150 recovers a clock synchronization signal C_Sync, the odd-numbered data O_D stream, and the even-numbered data E_D stream from the clock-embedded data signals E_DATA_C and O_DATA_C transmitted from the transmitter 114. The receiving device 150 includes a receiver 152, a clock-embedded signal recovery unit 160, a data integrator 154, and a clock pulse generator 156.

The receiver 152 converts the clock-embedded data signals E_DATA_C and O_DATA_C supplied from the transmitter 114 through the two transmission lines into the clock-embedded signals O_D_C and E_D_C and supplies them to the clock-embedded signal recovery unit 160. The receiver 152 converts the clock-embedded data signals E_DATA_C and O_DATA_C into the clock-embedded signals O_D_C and E_D_C having signal levels that the clock-embedded signal recovery unit 160 can process.

The embedded clock signal recovery unit 160 recovers the clock synchronization signal C_Sync, the odd-numbered data O_D stream, and the even-numbered data E_D stream from the clock-embedded signals O_D_C and E_D_C applied from the receiver 152 and supplies them to the clock pulse generator 156 and the data integrator 154, respectively.

The embedded clock signal recovery unit 160 recovering the odd-numbered data O_D stream and the even-numbered data E_D stream by comparing amplitudes of the clock-embedded signals O_D_C and E_D_C with reference voltage levels. The embedded clock signals O_D_C and E_D_C correspond to the pulse amplitude modulated signal having two positive polarity amplitudes displaying 0 and 1 and the pulse amplitude modulated signal having two negative polarity amplitudes displaying 0 and 1, generated by the clock-embedded signal generator 120, respectively. The reference voltages are used to detect the two positive polarity amplitudes displaying 0 and 1 and the two negative polarity amplitudes displaying 0 and 1.

The clock-embedded signal recovery unit 160 generates the clock synchronization signal C_Sync at the point when the polarities of the clock-embedded signals O_D_C and E_D_C are inverted from positive to negative or vice versa, and supplies the same to the clock pulse generator 156.

The data integrator 154 integrates the odd-numbered data O_D stream and the even-numbered data E_D stream, provided from the clock-embedded signal recovery unit 160, to generate the data stream DATA STREAM.

The clock pulse generator 156 generates a clock CLK synchronized with the clock synchronization signal C_Sync transmitted from the clock-embedded signal recovery unit 160.

Figure 2:
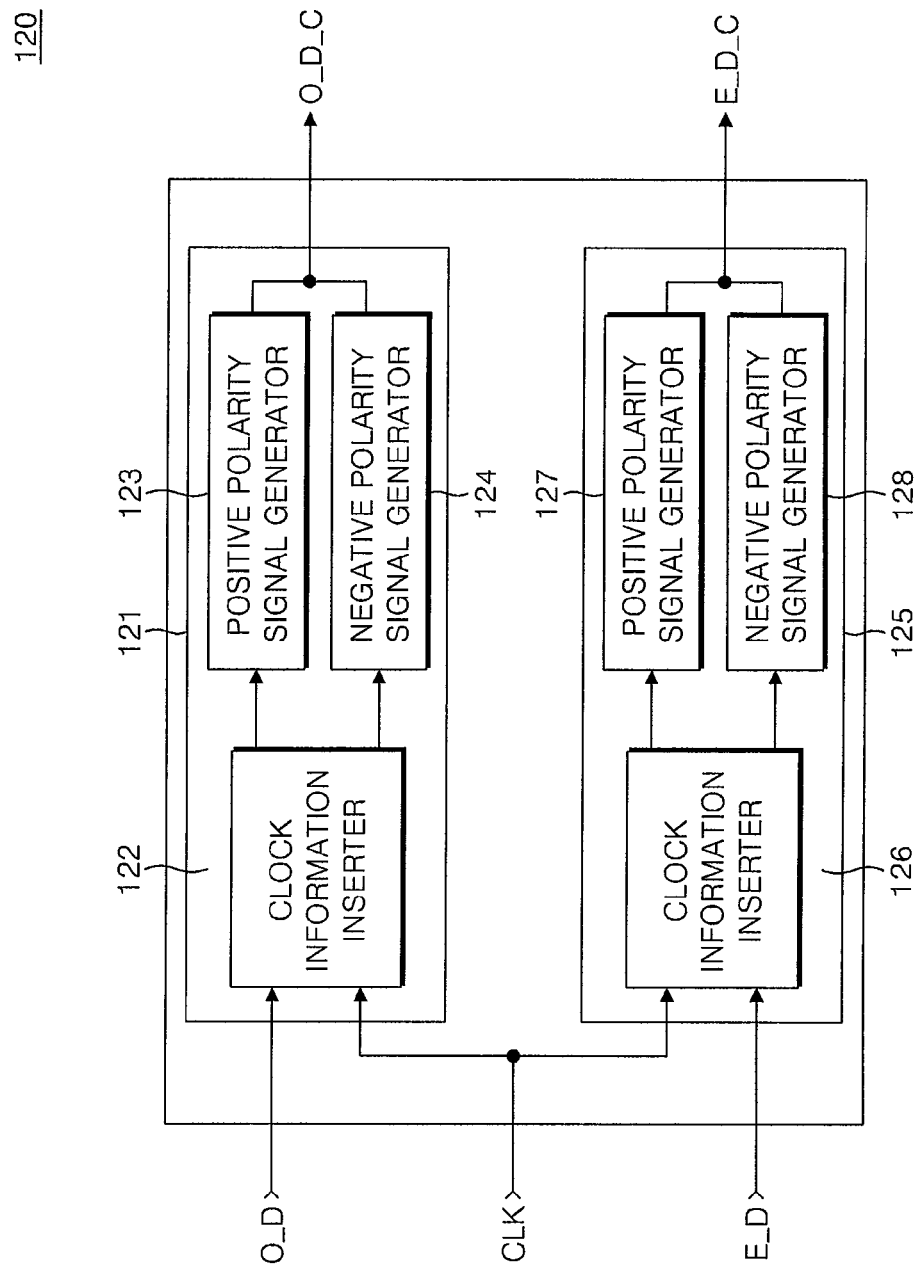
FIG. 2 is a block diagram of a clock-embedded signal generator shown in FIG. 1.

FIG. 2 is a block diagram of the clock-embedded signal generator 120 shown in FIG. 1. As shown in FIG. 2, the clock-embedded signal generator 120 includes an odd-numbered embedded clock signal generator 121 and an even-numbered embedded clock signal generator 125.

The odd-numbered embedded clock signal generator 121 receives the odd-numbered data O_D stream and the clock CLK and generates an odd-numbered embedded clock signal O_D_C in which the clock CLK information is embedded. The odd-numbered embedded clock signal generator 121 includes a clock information inserter 122, a positive polarity signal generator 123, and a negative polarity signal generator 124.

The clock information inserter 122 switches the odd-numbered data O_D stream in response the clock CLK to alternately supply the same to the positive polarity signal generator 123 or the negative polarity signal generator 124. The clock information inserter 122 provides the odd-numbered data O_D stream to the positive polarity signal generator 123 at a high level of an odd-numbered clock pulse and supplies the odd-numbered data O_D stream to the negative polarity signal generator 124 at a high level of an even-numbered clock pulse.

The clock information inserter 122 embeds the clock CLK information in the odd-numbered data O_D stream at the point when the polarity of the odd-numbered data O_D is inverted by switching the odd-numbered data O_D stream in response the clock CLK to alternately supply the same to the positive polarity signal generator 123 or the negative polarity signal generator 124.

The positive polarity signal generator 123 pulse amplitude modulates (PAM) the odd-numbered data O_D stream supplied from the clock information inserter 122 into a signal having two positive polarity amplitudes and outputs the signal as an odd-numbered embedded clock signal O_D_C. The two positive polarity amplitudes correspond 0 and 1, respectively, that the odd-numbered data O_D can have.

The negative polarity signal generator 124 pulse amplitude modulates (PAM) the odd-numbered data O_D stream supplied from the clock information inserter 122 into a signal having two negative polarity amplitudes and outputs the signal as an odd-numbered embedded clock signal O_D_C. The two negative polarity amplitudes correspond 0 and 1, respectively, that the odd-numbered data O_D can have.

The even-numbered embedded clock signal generator 125 receives the even-numbered data E_D stream and the clock CLK and generates an even-numbered embedded clock signal E_D_C in which the clock CLK information is embedded. The even-numbered embedded clock signal generator 125 includes a clock information inserter 126, a positive polarity signal generator 127, and a negative polarity signal generator 128.

The clock information inserter 126 switches the even-numbered data E_D stream in response the clock CLK to alternately supply the same to the negative polarity signal generator 128 or the positive polarity signal generator 127. The clock information inserter 126 provides the even-numbered data E_D stream to the negative polarity signal generator 128 at a high level of an odd-numbered clock pulse and supplies the even-numbered data E_D stream to the positive polarity signal generator 127 at a high level of an even-numbered clock pulse.

The clock information inserter 126 embeds the clock CLK information in the even-numbered data E_D at the point when the polarity of the even-numbered data E_D is inverted by switching the even-numbered data E_D stream in response the clock CLK to alternately supply the same to the negative polarity signal generator 128 or the positive polarity signal generator 127.

The positive polarity signal generator 127 pulse amplitude modulates (PAM) the even-numbered data E_D stream supplied from the clock information inserter 126 into a signal having two positive polarity amplitudes and outputs the signal as an even-numbered embedded clock signal E_D_C. The two positive polarity amplitudes correspond 0 and 1, respectively, that the even-numbered data E_D can have.

The negative polarity signal generator 128 pulse amplitude modulates (PAM) the even-numbered data E_D stream supplied from the clock information inserter 126 into a signal having two negative polarity amplitudes and outputs the signal as an even-numbered embedded clock signal E_D_C. The two negative polarity amplitudes correspond 0 and 1, respectively, that the even-numbered data O_D can have.

Figure 3:
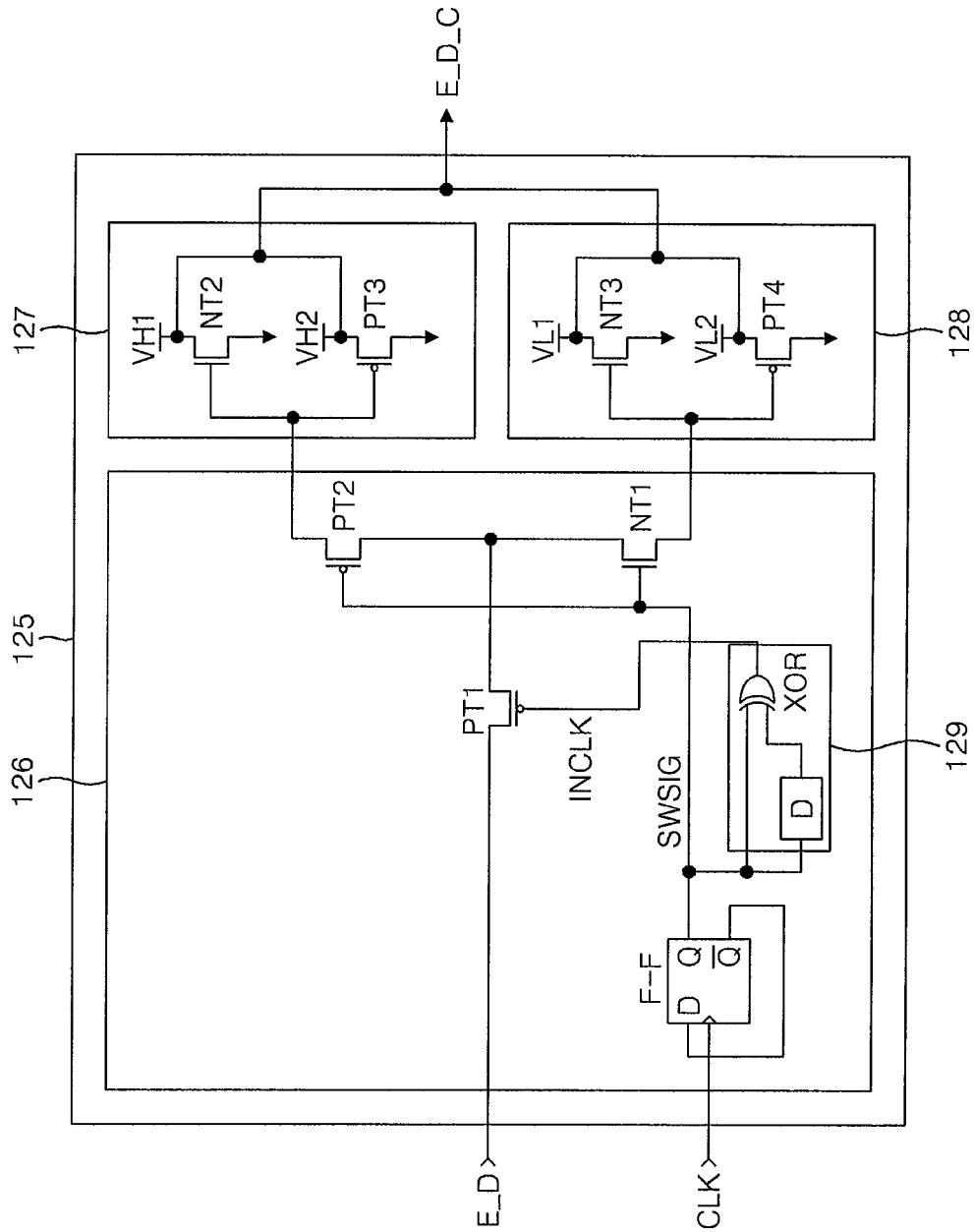
FIG. 3 is an exemplary circuit diagram of an even-numbered embedded clock signal generator shown in FIG. 2.

FIG. 3 is an exemplary circuit diagram of the even-numbered embedded clock signal generator 125 shown in FIG. 2. As shown in FIG. 3, the even-numbered embedded clock signal generator 125 receives the even-numbered data E_D stream and the clock CLK and generates an even-numbered embedded clock signal E_D_C in which the clock CLK information is embedded. The even-numbered embedded clock signal generator 125 includes the clock information inserter 126, the positive polarity signal generator 127, and the negative polarity signal generator 128.

The clock information inserter 126 includes a switch signal generator F-F for generating a switching signal SWSIG enabled at an odd-numbered high level of the clock CLK and disabled at an even-numbered high level of the clock CLK, a clock insertion signal generator 129 for generating a clock insertion signal INCLK for ensuring a margin of the clock-embedded CLK information, an input control transistor PT1 controlling the input of the even-numbered data E_D stream in response to the clock insertion signal INCLK, and polarity alternating transistors NT1 and PT2 alternately supplying the even-numbered data E_D stream to the negative polarity signal generator 128 and the positive polarity signal generator 127 in response to the switching signal SWSIG.

The switch signal generator F-F may be a D flip-flop including a clock terminal receiving the clock CLK, an inversion output terminal /Q connected to a data terminal D, and an output terminal Q outputting the switching signal SWSIG.

The clock insertion signal generator 129 includes a delay unit D for delaying the switching signal SWSIG, and an exclusive-OR gate XOR for exclusive-ORing the switching signal SWSIG and a delayed switching signal SWSIG_D and supplying the result as a clock insertion signal INCLK. The delay time of the delay unit D corresponds to a margin of the clock-embedded CLK information.

The input control transistor PT1 may be a PMOS transistor including a control terminal receiving the clock insertion signal INCLK, an input terminal supplied with the even-numbered data E_D, and an output terminal connected to input terminals of the polarity alternating transistors NT1 and PT2.

The polarity alternating transistors NT1 and PT2 includes a transistor NT1 supplying the even-numbered data E_D to the negative polarity signal generator 128 when the switching signal SWSIG is enabled, and a transistor PT2 supplying the even-numbered data E_D to the positive polarity signal generator 127 when the switching signal SWSIG is disabled.

The positive polarity signal generator 127 includes a transistor NT2 supplying a first level voltage VH1 of positive polarity as the even-numbered embedded clock signal E_D_C when the even-numbered data E_D transmitted from the clock information inserter 126 is "1", and a transistor PT3 supplying a second level polarity voltage VH2 of positive polarity as the even-numbered embedded clock signal E_D_C when the even-numbered data E_D transmitted from the clock information inserter 126 is "0".

The negative polarity signal generator 128 includes a transistor NT3 supplying a first level voltage VL1 of negative polarity as the even-numbered embedded clock signal E_D_C when the even-numbered data E_D transmitted from the clock information inserter 126 is "1", and a transistor PT4 supplying a second level voltage VL2 of negative polarity as the even-numbered embedded clock signal E_D_C when the even-numbered data E_D transmitted from the clock information inserter 126 is "0".

Since the odd-numbered embedded clock signal generator 121 can be readily appreciated from the configuration of the even-numbered embedded clock signal generator 125 by those skilled in the art, a detailed description will be omitted.

Figure 4:
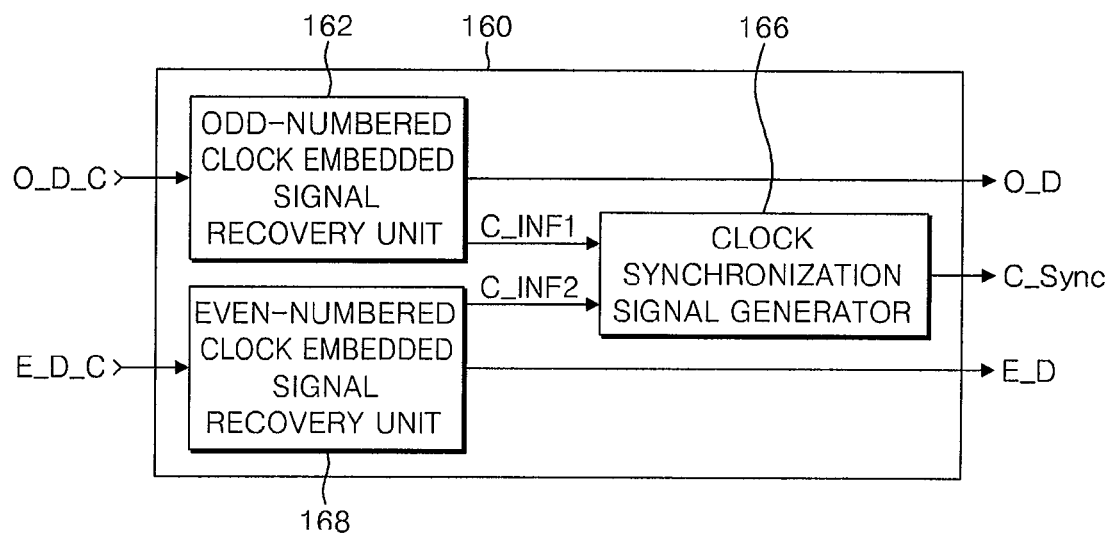
FIG. 4 is a block diagram of a clock-embedded signal recovery unit shown in FIG. 1.

FIG. 4 is a block diagram of the clock-embedded signal recovery unit 160 shown in FIG. 1. As shown in FIG. 4, the clock-embedded signal recovery unit 160 includes an odd-numbered embedded clock signal recovery unit 162, an even-numbered embedded clock signal recovery unit 168, and a clock synchronization signal generator 166.

The odd-numbered embedded clock signal recovery unit 162 recovers the odd-numbered data O_D stream and a first clock information signal C_INF1 from the odd-numbered embedded clock signal O_D_C. The first clock information signal C_INF1 indicates when the polarity of the odd-numbered data O_D stream is inverted.

The even-numbered embedded clock signal recovery unit 168 recovers the even-numbered data E_D stream and a second clock information signal C_INF2 from the even-numbered embedded clock signal E_D_C. The second clock information signal C_INF2 indicates when the polarity of the even-numbered data E_D stream is inverted.

The clock synchronization signal generator 166 generates the clock synchronization signal C_Sync using the first clock information signal C_INF1 applied from the odd-numbered embedded clock signal recovery unit 162 and the second clock information signal C_INF2 transmitted from the even-numbered embedded clock signal recovery unit 168. The first clock information signal C_INF1 is clock information embedded by the odd-numbered embedded clock signal generator 121, and the second clock information signal C_INF2 is clock information embedded by the even-numbered embedded clock signal generator 125.

Accordingly, the inversion times of the first clock information signal C_INF1 and the second clock information signal C_INF2 cross each other, and the clock synchronization signal generator 166 may detect the occurrence of the crossing point to supply the clock synchronization signal C_Sync.

Figure 5:
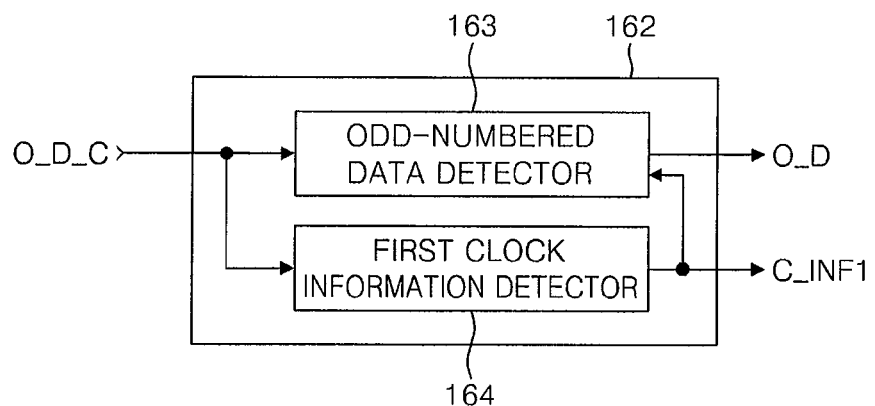
FIG. 5 is a block diagram of an odd-numbered embedded clock signal recovery unit shown in FIG. 4.

FIG. 5 is a block diagram of the odd-numbered embedded clock signal recovery unit 162 shown in FIG. 4. As shown in FIG. 5, the odd-numbered embedded clock signal recovery unit 162 includes an odd-numbered data detector 163 and a first clock information detector 164.

The odd-numbered data detector 163 recovers the odd-numbered data O_D stream from the odd-numbered embedded clock signal O_D_C. The odd-numbered data detector 163 compares the amplitude of the odd-numbered embedded clock signal O_D_C with first and second reference voltages VREF1 and VREF2, respectively. The first and second reference voltages VREF1 and VREF2 provide a margin for a reduction in the signal level transmitted from the transmitting device 110 to the receiving device 150. The first reference voltage VREF1 may be an intermediate value between the first level voltage VH1 of positive polarity and the second level voltage VH2 of positive polarity, and the second reference voltage VREF2 may be an intermediate value between the first level voltage VL1 of negative polarity and the second level voltage VL2 of negative polarity.

The odd-numbered data detector 163 compares the amplitude of the odd-numbered embedded clock signal O_D_C with the first reference voltage VREF1. The odd-numbered data detector 163 outputs "1" as the odd-numbered data O_D when the amplitude of the odd-numbered embedded clock signal O_D_C is greater than the first reference voltage VREF1, and outputs "0" as the odd-numbered data O_D when the amplitude of the odd-numbered embedded clock signal O_D_C is smaller than the first reference voltage VREF1.

When the first clock information C_INF1 is supplied from the first clock information detector 164, the odd-numbered data detector 163 compares the amplitude of the odd-numbered embedded clock signal O_D_C with the second reference voltage VREF2. The odd-numbered data detector 163 outputs "0" as the odd-numbered data O_D when the amplitude of the odd-numbered embedded clock signal O_D_C is greater than the second reference voltage VREF2, and outputs "1" as the odd-numbered data O_D when the amplitude of the odd-numbered embedded clock signal O_D_C is smaller than the second reference voltage VREF2.

The first clock information detector 164 receives the odd-numbered embedded clock signal O_D_C and recovers the first clock information C_INF1. The first clock information detector 164 detects when the polarity of the amplitude of the odd-numbered embedded clock signal O_D_C is inverted and supplies the first clock information C_INF1.

For example, the first clock information detector 164 detects when the amplitude of the odd-numbered embedded clock signal O_D_C coinciding with the first level voltage VH1 of positive polarity or the second level voltage VH2 of positive polarity coincides with the first level voltage VL1 of negative polarity or the second level voltage VL2 of negative polarity.

The first clock information detector 164 includes a differential amplifier for comparing the amplitude of the odd-numbered embedded clock signal O_D_C and the reference voltage. The reference voltage may be an intermediate value between the first level voltage VH1 of positive polarity and the first level voltage VL1 of negative polarity, or an intermediate value between the second level voltage VH2 of positive polarity and the second level voltage VL2 of negative polarity.

Figure 6:
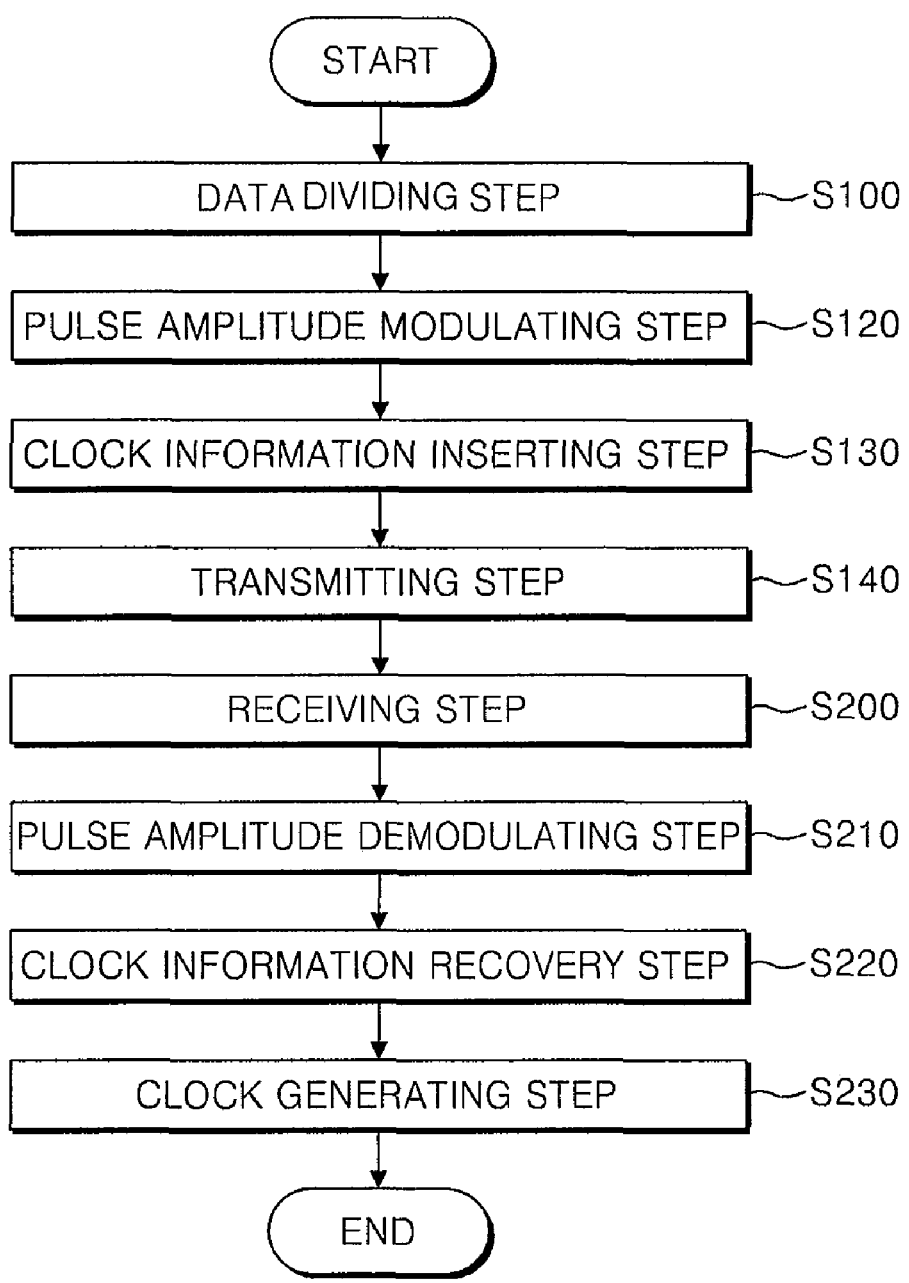
FIG. 6 is a flowchart illustrating a method for serial communication using embedded clock signals in accordance with the exemplary embodiment of the present invention.

FIG. 6 is a flowchart illustrating a method for serial communication using embedded clock signals in accordance with the exemplary embodiment of the present invention. Referring to FIG. 6, the method for serial communication using embedded clock signals in accordance with the exemplary embodiment of the present invention includes a data dividing step (S100), a pulse amplitude modulating step (S120), a clock information inserting step (S130), a transmitting step (S140), a receiving step (S200), a pulse amplitude demodulating step (S210), a clock information recovery step (S220), and a clock generating step (S230).

The data dividing step (S100) divides a data stream DATA STREAM into an odd-numbered data O_D stream and an even-numbered data E_D stream.

The pulse amplitude modulating step (S120) pulse amplitude modulates (PAM) the odd-numbered data O_D stream and the even-numbered data E_D stream, respectively, by varying polarities of amplitudes corresponding to the odd-numbered data O_D stream and the even-numbered data E_D stream. The pulse amplitude modulation (PAM) may be a 4-PAM having four amplitude levels corresponding to the respective odd-numbered data O_D and even-numbered data E_D. The four amplitude levels include a first level voltage VH1 of positive polarity, a second level voltage VH2 of positive polarity, a first level voltage VL1 of negative polarity, and a second level voltage VL2 of negative polarity.

For example, when the odd-numbered data O_D is "1", the corresponding amplitude is the first level voltage VH1 of positive polarity or the first level voltage VL1 of negative polarity and, when the odd-numbered data O_D is "0", the corresponding amplitude is the second level voltage VH2 of positive polarity or the second level voltage VL2 of negative polarity.

In the pulse amplitude modulating step (S120), when the amplitude corresponding to the odd-numbered data O_D is selected as a positive polarity voltage, the amplitude corresponding to the even-numbered data E_D may be selected as a negative polarity voltage, such that the polarities of the pulse amplitude modulated signals for the odd-numbered data O_D and the even-numbered data E_D are contrary to each other.

The clock information inserting step (S130) inverts the polarities of the amplitudes corresponding to the odd-numbered data O_D stream and the even-numbered data E_D stream in response to a clock CLK to perform pulse amplitude modulation (PAM) and generates embedded clock signals O_D_C and E_D_C. The clock CLK information is embedded at when the polarities of the amplitudes corresponding to the odd-numbered data O_D stream and the even-numbered data E_D stream are inverted.

For example, when the odd-numbered data O_D is "1" or "0", the clock information inserting step (S130) pulse amplitude modulates (PAM) the odd-numbered data O_D to have the amplitude corresponding to the first level voltage VH1 of positive polarity or the second level voltage VH2 of positive polarity. Subsequently, when a high level period of the clock CLK is input, the clock information inserting step (S130) pulse amplitude modulates (PAM) the odd-numbered data O_D to have the amplitude corresponding to the first level voltage VL1 of negative polarity or the second level voltage VL2 of negative polarity.

Accordingly, the clock CLK information can be embedded at the point when the polarity of the amplitude corresponding to the odd-numbered data O_D is inverted. The even-numbered data E_D is pulse amplitude modulated to have the amplitude corresponding to the negative polarity level voltage and then, when a high level period of the clock CLK is input, the even-numbered data E_D is pulse amplitude modulated to have an amplitude corresponding to the positive polarity voltage.

That is, when a high level period of the clock CLK is input, the polarities of the amplitudes of the odd-numbered data O_D stream and the even-numbered data E_D stream are inverted to be pulse amplitude modulated to have amplitudes corresponding to different polarity voltages. The reason for this is to transmit the clock-embedded signals Q_D_C and E_D_C to the receiver in the form of a differential signal.

The transmitting step (S140) transmits the clock-embedded signals O_D_C and E_D_C to the receiver through two transmitting lines. The transmitting step (S140) includes generating the clock-embedded data signals O_DATA_C and E_DATA_C by buffering and amplifying the clock-embedded signals O_D_C and E_D_C.

The receiving step (S200) receives and converts the clock-embedded data signals O_DATA_C and E_DATA_C into the clock-embedded signals O_D_C and E_D_C.

The pulse amplitude demodulating step (S210) recovers the odd-numbered data O_D stream and the even-numbered data E_D stream, respectively, from the clock-embedded signals O_D_C and E_D_C.

The clock-embedded signals O_D_C and E_D_C have four amplitude levels including the first level voltage VH1 of positive polarity, the second level voltage VH2 of positive polarity, the first level voltage VL1 of negative polarity, and the second level voltage VL2 of negative polarity, corresponding to the respective odd-numbered data O_D and even-numbered data E_D.

Accordingly, the pulse amplitude demodulating step (S210) recovers the odd-numbered data O_D stream and the even-numbered data E_D stream, respectively, by comparing the amplitudes of the clock-embedded signals O_D_C and E_D_C with reference voltages. The reference voltages include a first reference voltage VREF1 and a second reference voltage VREF2.

For example, the pulse amplitude demodulating step (S210) outputs "1" as the odd-numbered data O_D when the amplitude of the odd-numbered embedded clock signal O_D_C is greater than the first reference voltage VREF1, and outputs "0" as the odd-numbered data O_D when it is smaller than that.

When first clock information is provided from the first clock information detector 164, the pulse amplitude demodulating step (S210) compares the amplitude of the odd-numbered embedded clock signal O_D_C with the second reference voltage VREF2 and outputs "0" as the odd-numbered data O_D when the amplitude of the odd-numbered embedded clock signal O_D_C is greater than the second reference voltage VREF2, and outputs "1" as the odd-numbered data O_D when it is small than that.

The clock information recovery step (S220) detects when the polarities of the reference voltage levels applied to the amplitudes of the clock-embedded signals O_D_C and E_D_C are inverted and provides the clock synchronization signal C_Sync.

For example, the clock information recovery step (S220) detects when the amplitude of the odd-numbered embedded clock signal O_D_C coinciding with the first level voltage VH1 of positive polarity or the second level voltage VH2 of positive polarity coincides with the first level voltage VL1 of negative polarity or the second level voltage VL2 of negative polarity and supplies the first clock information C_INF1.

The clock information recovery step (S220) generates the first clock information signal C_INF1 and a second clock information signal C_INF2, detects when the first clock information signal C_INF1 and the second clock information signal C_INF2 cross each other to be inverted, and supplies the clock synchronization signal C_Sync.

The clock generating step (S230) generates the clock CLK by synchronizing the clock synchronizing signal C_Sync. Through the above-described process, the clock CLK information can be embedded in the data stream DATA STREAM and then transmitted and recovered.

Figure 7:
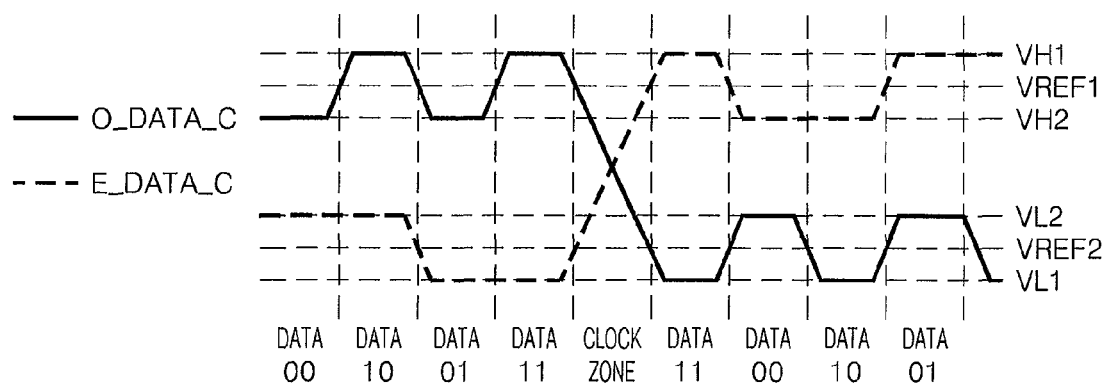
FIG. 7 is a diagram illustrating embedded clock signals generated in accordance with the exemplary embodiment of the present invention.

FIG. 7 is a diagram illustrating embedded clock signals generated by embedding one clock pulse in each 8-bit data in accordance with the exemplary embodiment of the present invention. As shown in FIG. 7, the clock-embedded signals O_DATA_C and E_DATA_C have data stream DATA STREAM values of "00 10 01 11" and "11 00 10 01", in which one clock pulse information is embedded after the 8-bit data.

The odd-numbered embedded clock signal O_DATA_C has positive polarity voltages VH2, VH1, VH2 and VH1 and negative polarity voltages VL1, VL2, VL1 and VL2, which are pulse amplitude modulation levels corresponding to "0101" and "1010". The clock CLK information is embedded at the point when the pulse amplitude modulation level is inverted from the positive polarity voltage to the negative polarity voltage.

The even-numbered embedded clock signal E_DATA_C has negative polarity voltages VL2, VL2, VL1 and VL1 and positive polarity voltages VH1, VH2, VH2 and VH1, which are pulse amplitude modulation levels corresponding to "0011" and "1001". The clock CLK information is embedded at the point when the pulse amplitude modulation level is inverted from the negative polarity voltage to the positive polarity voltage.

Accordingly, the receiver can detect the synchronization of the embedded clock by detecting when the polarities of the odd-numbered embedded clock signal O_DATA_C and the even-numbered embedded clock signal E_DATA_C cross each other to be inverted.

In the present embodiment, although the description has been given with respect to the case where one clock pulse is embedded in each 8-bit data which is 4-pulse amplitude modulated, the present invention is not limited thereto, but one clock pulse may be embedded in each 10-bit data, 16-bit data, or 20-bit data.

In the exemplary embodiment of the present invention, the mapping relationship of the pulse amplitude levels corresponding to the data stream DATA STREAM may be shown in the following Table 1:

TABLE 1

| Odd-numbered data (O_D) | Odd-numbered embedded clock data (O_DATA_C) | Even-numbered data (E_D) | Even-numbered embedded clock data (E_DATA_C) |
| --- | --- | --- | --- |
| 0 | VH2 | 0 | VL2 |
| 0 | VH2 | 1 | VL1 |
| 1 | VH1 | 0 | VL2 |
| 1 | VH1 | 1 | VL1 |

In accordance with the mapping relationship shown in Table 1, the pulse amplitude modulation for 8-bit data is carried out, and the polarities of the amplitudes corresponding to the data stream DATA STREAM is converted, thus embedding one clock pulse. Accordingly, the mapping relationship of the pulse amplitude levels corresponding to the data stream DATA STREAM after one clock pulse is embedded may be shown in the following Table 2:

TABLE 2

| Odd-numbered data (O_D) | Odd-numbered embedded clock data (O_DATA_C) | Even-numbered data (E_D) | Even-numbered embedded clock data (E_DATA_C) |
| --- | --- | --- | --- |
| 1 | VL1 | 0 | VH2 |
| 1 | VL1 | 1 | VH1 |
| 0 | VL2 | 0 | VH2 |
| 0 | VL2 | 1 | VH1 |

The mapping relationship between the modulated pulse amplitude levels and the demodulated data stream may be shown in the following Table 3:

TABLE 3

| Odd-numbered embedded clock data (O_DATA_C) | Odd-numbered data (O_D) | Even-numbered embedded clock data (E_DATA_C) | Even-numbered data (E_D) |
|---|---|---|---|
| O_DATA_C < VREF1 | 0 | E_DATA_C > VREF2 | 0 |
| O_DATA_C < VREF1 | 0 | E_DATA_C < VREF2 | 1 |
| O_DATA_C > VREF1 | 1 | E_DATA_C > VREF2 | 0 |
| O_DATA_C > VREF1 | 1 | E_DATA_C < VREF2 | 1 |

In accordance with the mapping relationship shown in Table 3, the pulse amplitude demodulation for 8-bit data is carried out, and the clock CLK is recovered by detecting when the polarities of the amplitudes of the clock-embedded data O_DATA_C and E_DATA_C are converted. Here, VREF1 is the first reference voltage, and VREF2 is the second reference voltage. After recovering the clock CLK, the second reference voltage VREF2 is used to recover the odd-numbered embedded clock data O_DATA_C, and the first reference voltage VREF1 is used to recover the even-numbered embedded clock data E_DATA_C.

The mapping relationship between the modulated pulse amplitude levels and the demodulated data stream after recovering the clock CLK may be shown in the following Table 4:

TABLE 4

| Odd-numbered embedded clock data (O_DATA_C) | Odd-numbered data (O_D) | Even-numbered embedded clock data (E_DATA_C) | Even-numbered data (E_D) |
|---|---|---|---|
| O_DATA_C > VREF2 | 0 | E_DATA_C < VREF1 | 0 |
| O_DATA_C > VREF2 | 0 | E_DATA_C > VREF1 | 1 |
| O_DATA_C < VREF2 | 1 | E_DATA_C < VREF1 | 0 |
| O_DATA_C < VREF2 | 1 | E_DATA_C > VREF1 | 1 |

Accordingly, the method for serial communication in accordance with the exemplary embodiment of the present invention can embed the clock information in the data stream DATA STREAM with the 4-pulse amplitude modulation (4-PAM) in which 2-bit is transmitted during one symbol period.

Figure 8:
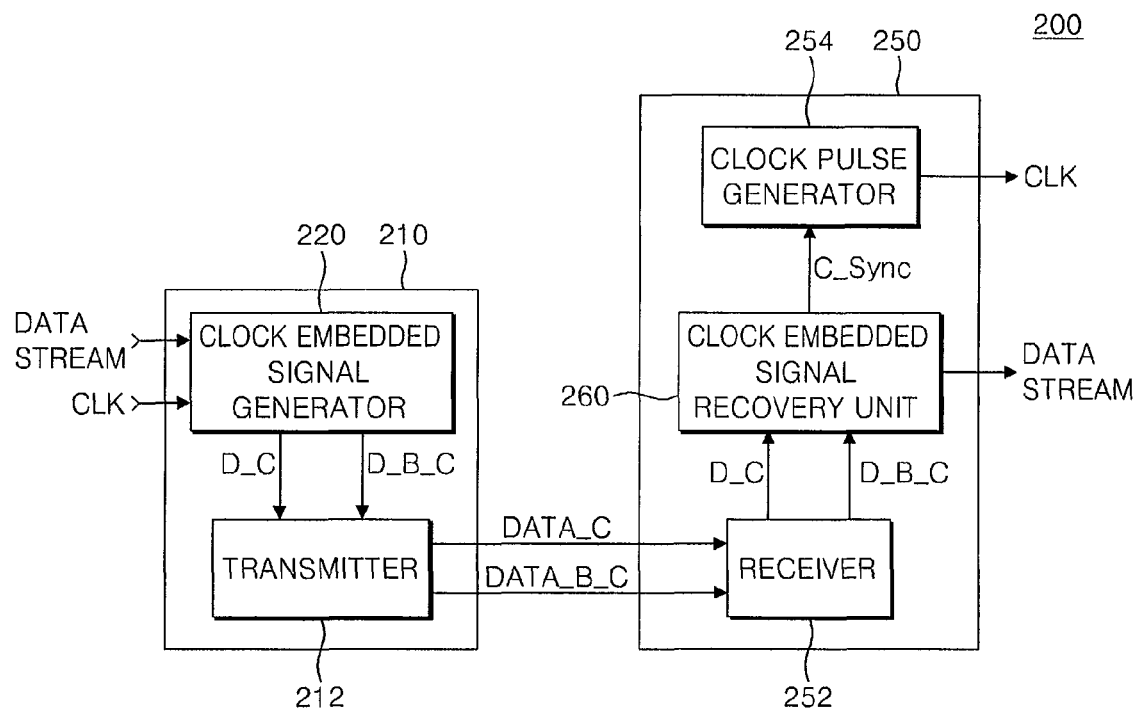
FIG. 8 is a block diagram of an apparatus for serial communication using embedded clock signals in accordance with an exemplary embodiment of the present invention.

FIG. 8 is a block diagram of an apparatus for serial communication using embedded clock signals in accordance with an exemplary embodiment of the present invention. The apparatus for serial communication using embedded clock signals in accordance with an exemplary embodiment of the present invention includes a transmitting device 210 and a receiving device 250.

The transmitting device 210 transmits embedded clock data signals DATA_C and DATA_B_C, generated by embedding clock CLK information in a data stream DATA STREAM, to the receiving device 250. The transmitting device 210 includes a clock-embedded signal generator 220 and a transmitter 212.

The embedded clock signal generator 220 generates a data signal DATA and a data-bar signal DATA_B corresponding to the data stream DATA STERAM and, at the same time, generates embedded clock signals D_C and D_B_C by embedding the clock CLK information supplied from the outside in the data signal DATA and the data-bar signal DATA_B, and provides them to the receiving device 250. The data-bar signal DATA_B is a signal having an inverted phase with respect to the data signal DATA.

The embedded clock signal generator 220 displays data of the data stream DATA STREAM according to relative positions of the data signal DATA and the data-bar signal DATA_B. For example, when the data is "1", the data signal DATA is greater than the data-bar signal DATA_B, whereas, when the data is "0", the data signal DATA is smaller than the data-bar signal DATA_B. Moreover, the clock-embedded signal generator 220 embeds the clock CLK information at the point when the data signal DATA and the data-bar signal DATA_B are equalized.

The transmitter 212 converts the clock-embedded signals D_C and D_B_C applied from the clock-embedded signal generator 220 into the clock-embedded data signals DATA_C and DATA_B_C and transmits them to the receiving device 250 through two transmission lines. The transmitter 212 performs a buffering function in order to simultaneously transmit the clock-embedded data signals DATA_C and DATA_B_C through the two transmission lines in the form of a differential signal. Moreover, the transmitter 212 amplifies the clock-embedded signals D_C and D_B_C to be converted into the clock-embedded data signals DATA_C and DATA_B_C suitable for the transmission.

The receiving device 250 recovers a clock synchronization signal C_Sync and the data stream DATA STREAM from the clock-embedded data signals DATA_C and DATA_B_C transmitted from the transmitter 212. The receiving device 250 includes a receiver 252, a clock-embedded signal recovery unit 260, and a clock pulse generator 254.

The receiver 252 converts the clock-embedded data signals DATA_C and DATA_B_C supplied from the transmitter 212 through the two transmission lines into the clock-embedded signals D_C and D_B_C, and supplies them to the clock-embedded signal recovery unit 260. The receiver 252 converts the clock-embedded data signals DATA_C and DATA_B_C into the clock-embedded signals D_C and D_B_C having signal levels that the clock-embedded signal recovery unit 260 can process.

The embedded clock signal recovery unit 260 recovers the clock synchronization signal C_Sync and the data stream DATA STREAM from the clock-embedded signals D_C and D_B_C transmitted from the receiver 252 and supplies the clock synchronization signal C_Sync to the clock pulse generator 254.

The clock pulse generator 254 generators the clock CLK synchronized with the clock synchronization signal C_Sync.

Figure 9:
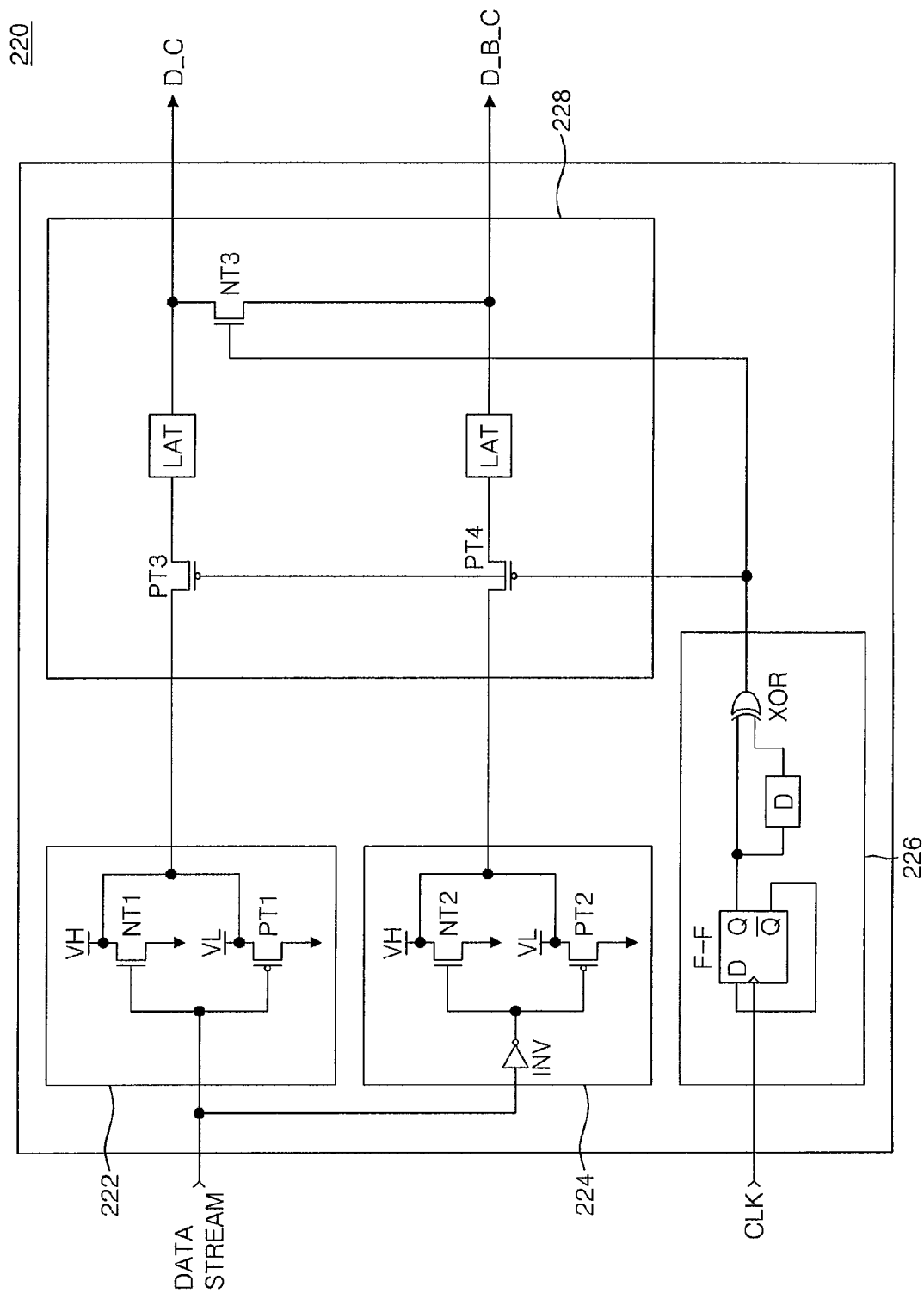
FIG. 9 is an exemplary circuit diagram of a clock-embedded signal generator shown in FIG. 8.

FIG. 9 is an exemplary circuit diagram of the clock-embedded signal generator 220 shown in FIG. 8. As shown in FIG. 9, the clock-embedded signal generator 220 includes a data signal generator 222, a data-bar signal generator 224, a clock embedding control unit 226, and a clock embedding unit 228.

The data signal generator 222 receives the data stream DATA STREAM and generates the data signal DATA. The data signal generator 222 includes a transistor NT1 supplying a positive polarity voltage VH as the data signal DATA when the data of the data stream DATA STREAM is "1", and a transistor PT1 supplying a negative polarity voltage VL as the data signal DATA when the data of the data stream DATA STREAM is "0".

The data-bar signal generator 224 receives the data stream DATA STREAM and generates the data-bar signal DATA_B. The data-bar signal generator 224 includes an inverter INV inverting the phase of data of the data stream DATA STREAM and outputting the inverted data, a transistor NT2 supplying the positive polarity voltage VH as the data signal DATA_B when the output of the inverter is "1", and a transistor PT2 supplying the negative polarity voltage VL as the data signal DATA when the output of the inverter is "0".

The clock embedding control unit 226 generates a control signal CNTL for equalizing the data signal DATA and the data-bar signal DATA_B in response to the clock CLK and supplies the control signal CNTL to the clock embedding unit 228.

In particular, the clock embedding control unit 226 includes a D flip-flop F-F having a clock terminal receiving the clock CLK, an inversion output terminal /Q connected to a data terminal D, and an output terminal Q outputting an inversion signal CONV, a delay unit D for delaying the inversion signal CONV to generate an inversion delayed signal CONV_D, and an exclusive-OR gate XOR for exclusive-ORing the inversion signal CONV and the inversion delayed signal CONV_D and supplying the result as the control signal CNTL. The delay time of the delay unit D corresponds to a margin of the clock CLK information embedded by the equalization.

The clock embedding unit 228 embeds the clock CLK information by equalizing the data signal DATA and the data-bar signal DATA_B in response to the control signal CNTL. The clock embedding unit 228 includes transistors PT3 and PT4 for blocking the input of the data signal DATA of the data signal generator 222 and the data-bar signal DATA_B of the data-bar signal generator 224 when the control signal CNTL is enabled, latches LAT connected to the output terminals of the respective transistors, and a transistor NT3 for electrically connecting a data signal DATA line to a data-bar signal DATA_B line to equalize the data signal DATA and the data-bar signal DATA_B when the control signal CNTL are enabled.

Figure 10:
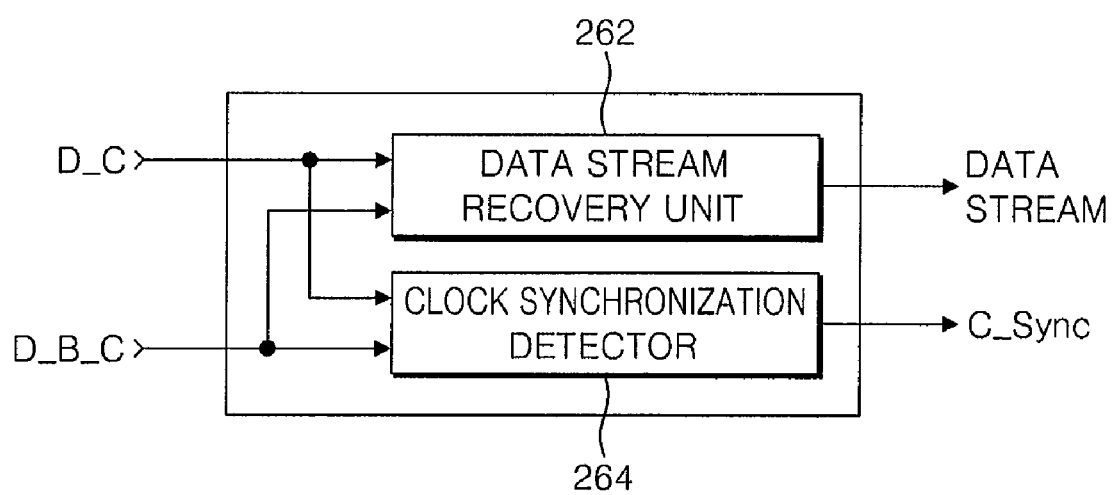
FIG. 10 is a block diagram of a clock-embedded signal recovery unit shown in FIG. 8.

FIG. 10 is a block diagram of the clock-embedded signal recovery unit 260 shown in FIG. 8. As shown in FIG. 10, the clock-embedded signal recovery unit 260 includes a data stream recovery unit 262 and a clock synchronization detector 264.

The data stream recovery unit 262 recovers the data stream DATA STREAM from the clock-embedded signals D_C and D_B_C. The data stream recovery unit 262 recovers the data stream DATA STREAM according to relative positions of the clock-embedded signals D_C and D_B_C, which are differential signals. For example, the data stream recovery unit 262 compares the clock-embedded signals D_C and D_B_C with each other and recovers the data stream DATA STREAM as "1" when D_C is greater than D_B_C, or as "0" when D_C is smaller than D_B_C. The data stream recovery unit 262 may be implemented by a differential amplifier receiving, comparing, and outputting the clock-embedded signals D_C and D_B_C.

The clock synchronization detector 264 detects an equalized portion from the clock-embedded signals D_C and D_B_C, which are differential signals, and supplies the result as the clock synchronization signal C_Sync. The clock synchronization detector 264 compares the clock-embedded signals D_C and D_B_C with each other and, when D_C and D_B_C are equal to each other, generates the clock synchronization signal C_Sync.

The clock synchronization detector 264 can detect the clock synchronization signal C_Sync using a first reference level voltage VH_REF between the maximum level of the clock-embedded signals D_C and D_B_C and a (D_C+D_B_C)/2 level, and a second reference level voltage VL_REF between the minimum level of the clock-embedded signals D_C and D_B_C and a (D_C+D_B_C)/2 level.

For example, in a case where the clock-embedded signal D_C is smaller than the first reference level voltage VH_REF and the clock-embedded signal D_B_C is greater than the second reference level voltage VL_REF, the clock synchronization detector 264 generates the clock synchronization signal C_Sync. Even in the case where the clock-embedded signal D_C is greater than the second reference level voltage VL_REF and the clock-embedded signal D_B_C is smaller than the first reference level voltage VH_REF, the clock synchronization detector 264 operates in the same manner as above.

Figure 11:
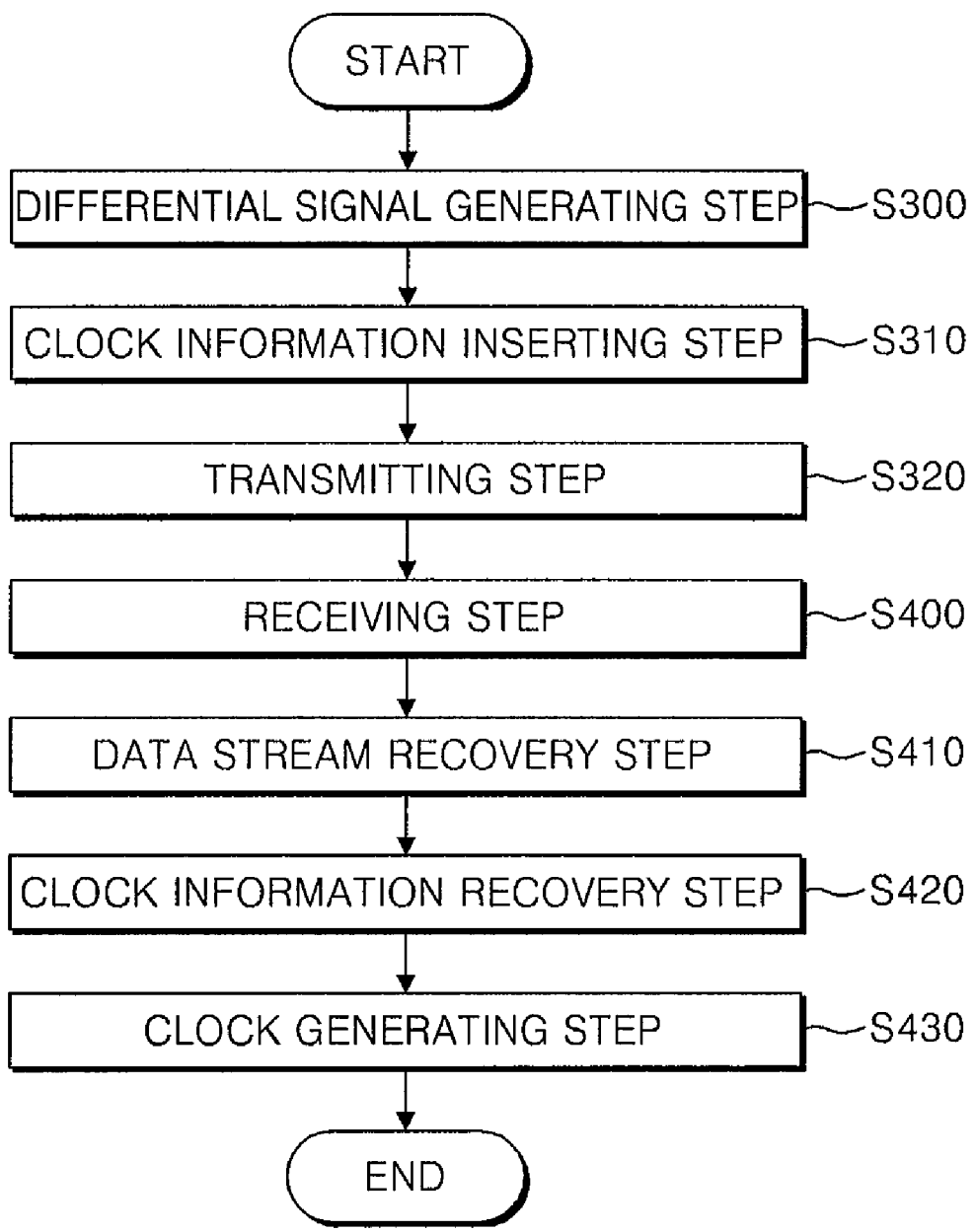
FIG. 11 is a flowchart illustrating a method for serial communication using embedded clock signals in accordance with another embodiment of the present invention.

FIG. 11 is a flowchart illustrating a method for serial communication using embedded clock signals in accordance with an exemplary embodiment of the present invention. As shown in FIG. 11, the method for serial communication using embedded clock signals in accordance with an exemplary embodiment of the present invention includes a differential signal generating step (S300), a clock information inserting step (S310), a transmitting step (S320), a receiving step (S400), a data stream recovery step (S410), a clock information recovery step (S420), and a clock generating step (S430).

The differential signal generating step (S300) generates a data signal DATA and a data-bar signal DATA_B, which correspond to a data stream DATA STREAM, and displays data of the data stream DATA STREAM according to relative positions of the data signal DATA and the data-bar signal DATA_B.

For example, when the data of the data stream DATA STREAM is "1", the differential signal generating step (S300) generates the data signal DATA to have a positive polarity voltage VH and the data-bar signal DATA_B to have a negative polarity voltage VL such that the data signal DATA is greater than the data-bar signal DATA_B. On the contrary, when the data of the data stream DATA STREAM is "0", the differential signal generating step (S300) generates the data signal DATA to have the negative polarity voltage VL and the data-bar signal DATA_B to have the positive polarity voltage VH such that the data signal DATA is smaller than the data-bar signal DATA_B.

The clock information inserting step (S310) embeds clock CLK information in the data signal DATA and the data-bar signal DATA_B by equalizing the data signal DATA and the data-bar signal DATA_B in response to the clock CLK and supplies them as embedded clock signals D_C and D_B_C. For example, when a high level period of the clock CLK is input, the clock information inserting step (S310) equalizes the data signal DATA and the data-bar signal DATA_B to output a signal having an intermediate value between the data signal DATA and the data-bar signal DATA_B.

The transmitting step (S320) buffers and amplifies the clock-embedded signals D_C and D_B_C to generate embedded clock data signals DATA_C and DATA_B_C, which are differential signals, and transmits them to the receiver 252 through two transmission lines.

The receiving step (S400) receives the clock-embedded data signals DATA_C and DATA_B_C and converts them into the clock-embedded signals D_C and D_B_C.

The data stream recovery step (S410) recovers the data stream DATA STREAM from the clock-embedded signals D_C and D_B_C according to relative positions of the clock-embedded signals D_C and D_B_C, which are differential signals. For example, the data stream recovery step (S410) compares the clock-embedded signals D_C and D_B_C with each other and recovers the data stream DATA STREAM as "1" when D_C is greater than D_B_C, or as "0" when D_C is smaller than D_B_C.

The clock information recovery step (S420) detects an equalized portion from the clock-embedded signals D_C and D_B_C, which are differential signals, to generate a clock synchronization signal C_Sync. For example, the clock information recovery step (S420) compares the clock-embedded signals D_C and D_B_C with each other and, when D_C and D_B_C are equal to each other, determines that it is the equalized portion and then generates the clock synchronization signal C_Sync.

Moreover, the clock information recovery step (S420) can detect the clock synchronization signal C_Sync using a first reference level voltage VH_REF and a second reference level voltage VL_REF between the maximum level voltage VH, the minimum level voltage VL, and a (VH+HL)/2 level.

For example, in a case where the clock-embedded signal D_C is greater than the second reference level voltage VL_REF and the clock-embedded signal D_B_C is smaller than the first reference level voltage VH_REF, the clock information recovery step (S420) determines that it is the equalized portion and generates the clock synchronization signal C_Sync.

The clock generating step (S430) generates the clock CLK by synchronizing with the clock synchronization signal C_Sync. Through the above-described process, the clock CLK information can be embedded in the data stream DATA STREAM and then transmitted and recovered.

Figure 12:
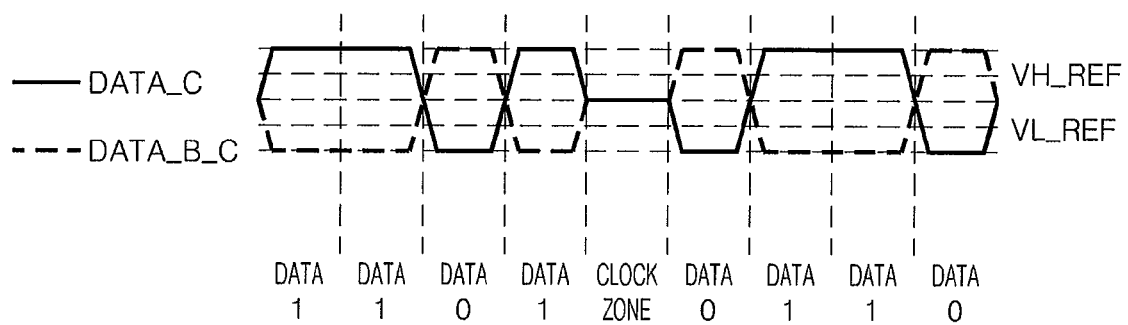
FIG. 12 is a diagram illustrating embedded clock signals generated in accordance with an exemplary embodiment of the present invention.

FIG. 12 is a diagram illustrating embedded clock signals generated by embedding one clock pulse in each 4-bit data in accordance with an exemplary embodiment of the present invention. As shown in FIG. 12, the clock-embedded data signals DATA_C and DATA_B_C generated in accordance with an exemplary embodiment of the present invention have data stream DATA STREAM values of "1101" and "0110", in which clock pulse information is embedded after the 4-bit data.

The embedded clock data signal DATA_C has a voltage level relatively higher than the clock-embedded data signal DATA_B_C when the data value of the data stream DATA STREAM is "1", and the clock-embedded data signal DATA_C has a voltage level relatively lower than the clock-embedded data signal DATA_B_C when the data value is "0". The clock CLK information is embedded in the equalized portion of the clock-embedded data signals DATA_C and DATA_B_C, i.e., in an intermediate level portion between the maximum level voltage and the minimum level voltage of the clock-embedded data signals DATA_C and DATA_B_C.

Accordingly, the receiving device can detect the synchronization of the clock-embedded in the data stream by detecting the equalized portion of the clock-embedded signals.

In this embodiment, although the description has been given with respect to the case where one clock pulse is embedded in each 4-bit data converted into the differential signal, the present invention is not limited thereto, but one clock pulse may be embedded in each 8-bit data, 10-bit data, 16-bit data, or 20-bit data.

The methods and apparatuses for serial communication using embedded clock signals described with respect to FIGS. 1 to 7 and FIGS. 8 to 12 can be applied to an interface between a graphic controller and a timing controller or an interface between a timing controller and a driver integrated circuit (IC) in a liquid crystal display device.

Moreover, the methods and apparatuses for serial communication using embedded clock signals described with respect to FIGS. 1 to 7 and FIGS. 8 to 12 can be applied to various serial communications such as Serial ATA, PCI Express, Gigabit Ethernet, etc., in addition to the liquid crystal display device.

As described above, since the method and apparatus for serial communication of the present invention can perform serial communication using embedded clock signals in which clock information is embedded at the point when the polarities of the odd-numbered and even-numbered data signals, which are pulse amplitude modulated signals having four levels, are inverted, or using embedded clock signals in which the clock information is embedded by equalizing differential signals, a dedicated clock channel and a channel coding are not required. Accordingly, the present invention provides advantageous effects in that electromagnetic Interference (EMI) due to the clock channel is eliminated and the 2-bit overhead due to the channel coding is reduced.

Although the present invention has been described with reference to certain exemplary embodiments thereof, it will be understood by those skilled in the art that a variety of modifications and variations may be made to the present invention without departing from the spirit or scope of the present invention defined in the appended claims, and their equivalents.

What is claimed is:

1. An apparatus for serial communication using embedded clock signals, comprising:
   a data divider for dividing a data stream into odd-numbered and even-numbered data streams;
   a clock-embedded signal generator for generating odd-numbered and even-numbered embedded clock signals by pulse amplitude modulating the odd-numbered and even-numbered data streams and, when an external clock is input, inverting polarities of the pulse amplitude modulated odd-numbered and even-numbered data streams;
   a clock-embedded signal recovery unit for recovering the odd-numbered and even-numbered data streams by comparing amplitudes of the odd-numbered and even-numbered embedded clock signals with reference voltages, respectively, and recovering synchronization information of the clock by detecting when amplitude polarities of the odd-numbered and even-numbered embedded clock signals are inverted; and
   a data integrator for integrating the odd-numbered and even-numbered data streams and supplying the result as the data stream.

2. The apparatus of claim 1, wherein the clock-embedded signal generator comprises:
   a first signal generator for generating the odd-numbered embedded clock signal; and
   a second signal generator for generating the even-numbered embedded clock signal,
   wherein the first and second signal generators pulse amplitude modulate the odd-numbered and even-numbered data streams to have amplitudes having different polarities, respectively.

3. The apparatus of claim 2, wherein the first signal generator comprises:
   a first positive polarity signal generator for pulse amplitude modulating the odd-numbered data stream into a signal having two positive polarity amplitudes;

a first negative polarity signal generator for pulse amplitude modulating the odd-numbered data stream into a signal having two negative polarity amplitudes; and a first clock information inserter for alternately switching the odd-numbered data stream to the positive polarity signal generator and the negative polarity signal generator in response to the clock.

4. The apparatus of claim 3, wherein the second signal generator comprises:

a second positive polarity signal generator for pulse amplitude modulating the even-numbered data stream into a signal having two positive polarity amplitudes;

a second negative polarity signal generator for pulse amplitude modulating the even-numbered data stream into a signal having two negative polarity amplitudes; and a second clock information inserter for alternately switching the even-numbered data stream to the negative polarity signal generator and the positive polarity signal generator in response to the clock.

5. A method for serial communication using embedded clock signals, the method comprising:

dividing a data stream into odd-numbered and even-numbered data streams;

pulse amplitude modulating the odd-numbered and even-numbered data streams into reference level voltages, respectively;

generating odd-numbered and even-numbered embedded clock signals by inverting polarities of amplitudes corresponding to the odd-numbered and even-numbered data streams in response to a clock;

recovering the odd-numbered and even-numbered data streams by comparing amplitudes of the odd-numbered and even-numbered embedded clock signals with reference voltages, respectively; and recovering synchronization information of the clock by detecting when polarities of amplitudes of the odd-numbered and even-numbered embedded clock signals are inverted.

6. The method of claim 5, wherein the reference level voltages comprises a first level voltage of positive polarity, a second level voltage of positive polarity, a first level voltage of negative polarity, and a second level voltage of negative polarity.

7. The method of claim 6, wherein the odd-numbered and even-numbered data streams are modulated by varying polarities.

8. The method of claim 7, wherein the odd-numbered and even-numbered data streams are converted into a first level voltage of positive polarity or a first level voltage of negative polarity when a data value of the odd-numbered and even-numbered data streams is "1", and converted into a second level voltage of positive polarity or a second level voltage of negative polarity when the data value of the odd-numbered and even-numbered data streams is "0".

9. The method of claim 6, wherein, the reference voltages comprise a first reference voltage having an intermediate value between the first level voltage of positive polarity and the second level voltage of positive polarity, and a second reference voltage having an intermediate value between the first level voltage of negative polarity and the second level voltage of negative polarity.

10. The method of claim 9, wherein the odd-numbered and even-numbered data streams are recovered by comparing amplitude voltages of the odd-numbered and even-numbered embedded clock signals with the reference voltages.

* * * * *